United States Patent [19]

Newkirk et al.

[11] 4,054,686

[45] Oct. 18, 1977

[54] METHOD FOR PREPARING HIGH TRANSITION TEMPERATURE $Nb_3Ge$ SUPERCONDUCTORS

[75] Inventors: Lawrence R. Newkirk, Los Alamos; Flavio A. Valencia, Santa Fe, both of N. Mex.

[73] Assignee: The United States of America as represented by the United States Energy Research and Development Administration, Washington, D.C.

[21] Appl. No.: 590,757

[22] Filed: June 26, 1975

[51] Int. Cl.$^2$ .................................. H01L 39/12
[52] U.S. Cl. .............................. 427/62; 29/599; 423/492; 75/134 G; 75/174; 427/124; 427/250
[58] Field of Search .......... 427/62, 124, 61, 250; 29/599; 423/492; 75/134 G, 174

[56] References Cited

U.S. PATENT DOCUMENTS

| 3,525,637 | 8/1970 | Kim | 427/62 |
|---|---|---|---|
| 3,556,842 | 1/1971 | Kim | 427/62 |
| 3,573,978 | 4/1971 | Kim et al. | 427/62 |
| 3,630,769 | 12/1971 | Hart | 427/62 |
| 3,665,595 | 5/1972 | Tanaka | 29/599 |

OTHER PUBLICATIONS

Carpenter, The Composition, Range, Decomposition...$Nb_3Ge$, pp. 2141-2144, vol. 67, (10-1963).
Hardbook of Prep. Inorganic Chemistry, Edited by George Bauer, vol. 2, pp. 1302-1303, 1305, 1311 (1965).

*Primary Examiner*—Ralph S. Kendall
*Assistant Examiner*—John D. Smith
*Attorney, Agent, or Firm*—Dean E. Carlson; Edward C. Walterscheid

[57] ABSTRACT

Bulk coatings of $Nb_3Ge$ superconductors having transition temperatures in excess of 20 K are readily formed by a chemical vapor deposition technique involving the coreduction of $NbCl_5$ and $GeCl_4$ in the presence of hydrogen. The $NbCl_5$ vapor may advantageously be formed quantitatively in the temperature range of about 250° to 260° C by the chlorination of Nb metal provided the partial pressure of the product $NbCl_5$ vapor is maintained at or below about 0.1 atm.

2 Claims, 1 Drawing Figure

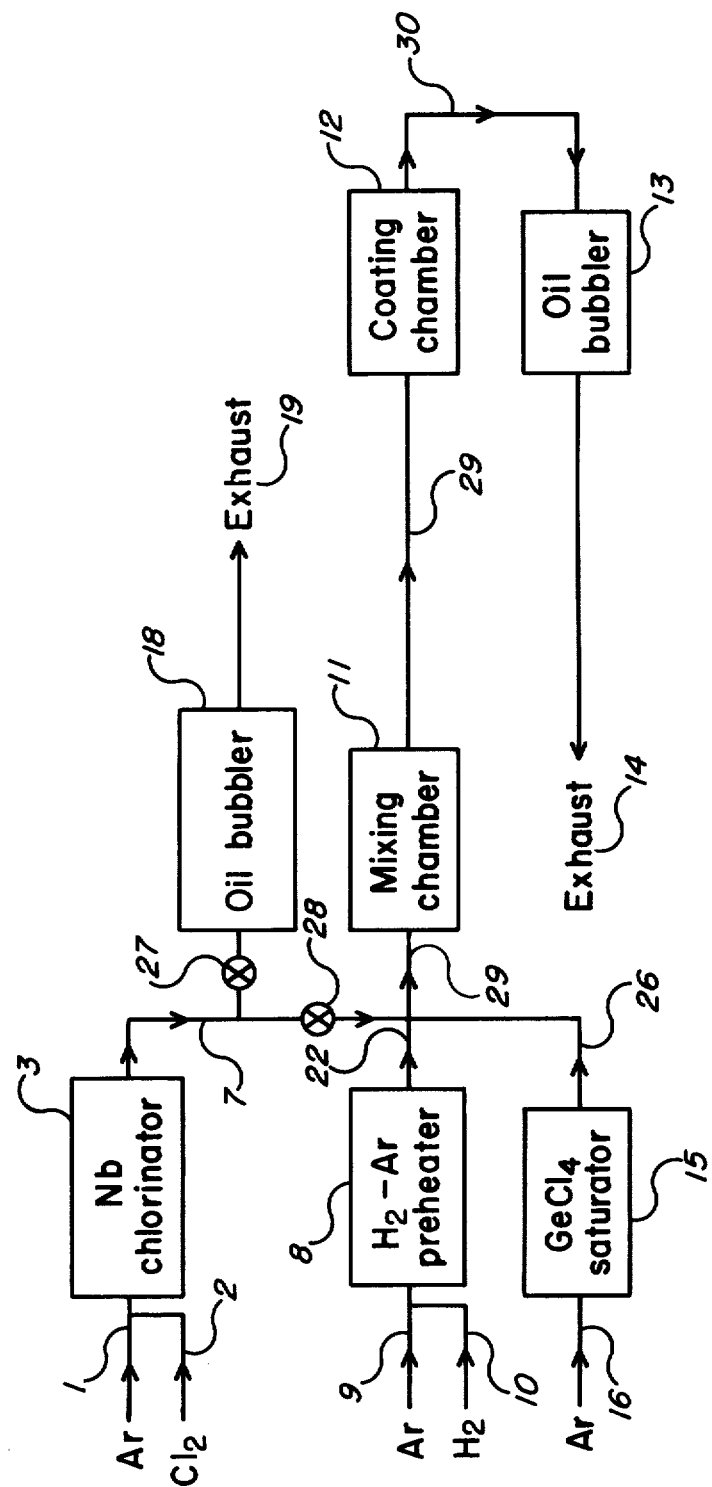

METHOD FOR PREPARING HIGH TRANSITION TEMPERATURE $Nb_3Ge$ SUPERCONDUCTORS

BACKGROUND OF THE INVENTION

This invention relates to a method of forming bulk coatings of high transition temperature $Nb_3Ge$ superconductors by the coreduction of $NbCl_5$ and $GeCl_4$ vapor in the presence of hydrogen, and more particularly to a method in which the requisite $NbCl_5$ vapor is formed at a temperature of about 250° l to 260° C.

The art discloses that the superconducting material with the highest known transition temperature is niobium germanide ($Nb_3Ge$) having an A-15 structure. A transition temperature of 22.5 K has been measured using small sections of an extremely thin film ($< 0.1$ $\mu m$) of $Nb_3Ge$ deposited by sputtering under vacuum conditions. Bulk coatings are required, however, for practical applications, e.g., in superconducting power transmission, and such coatings may not be economically produced by sputtering techniques. The literature now teaches that such coatings may be produced by chemical vapor deposition in which $NbCl_5$ and $GeCl_4$ vapors are coreduced in the presence of hydrogen.

It is known that the $NbCl_5$ vapor may be produced either by the vaporization of $NbCl_5$ powder or by the quantitative chlorination of Nb metal at temperatures in excess of 800° C. Both of these methods for producing $NbCl_5$ have certain disadvantages. Thus, for example, vaporization from the powder requires both a uniform powder size and a very uniform powder feed. There is a tendency for the powder to agglomerate to some extent. The disadvantage of the prior art chlorination technique is the necessity of keeping the salt vapor at a relatively high temperature from production to reaction. Failure to do this can result in decomposition to $NbCl_3$ which destroys the quantitative aspects of the process.

SUMMARY OF THE INVENTION

Quantitative chlorination of Nb metal to produce a required flow of $NbCl_5$ vapor for use in the chemical vapor deposition of $Nb_3Ge$ is advantageously achieved at a temperature range of about 250° to 260° C through control of the partial pressure of the $NbCl_5$ vapor produced. To avoid the formation of the $NbCl_3$ through the reaction of the $NbCl_5$ with the Nb metal, the partial pressure of the $NbCl_5$ vapor must be maintained at or below about 0.1 atm. This is readily accomplished by diluting it with an inert gas as, e.g., Ar.

BRIEF DESCRIPTION OF THE DRAWING

The FIGURE is a flow chart of a process for the chemical vapor deposition of $Nb_3Ge$ coatings which incorporates the improvement of the invention.

DESCRIPTION OF THE PREFERRED EMBODIMENT

To prepare bulk coatings of high-transition-temperature $Nb_3Ge$ superconductors by chemical vapor deposition it is necessary that the ratio of Nb to Ge in the chlorides undergoing hydrogen reduction be rather carefully controlled. Otherwise, a disproportionate amount of other compounds or phases as, e.g., $Nb_5Ge_3$, $NbGe_2$, or a solid solution of Ge in Nb, or $Nb_3Ge$ which is not stoichiometric (i.e., does not contain the correct amount of Ge), may be produced. Since it is only the $Nb_3Ge$ of the correct composition which has the high transition temperature, it is highly desirable that production of this compound with an A-15 structure be maximized.

This ratio can be carefully controlled provided that quantitative chlorination of Nb metal is achieved in the flow system producing the Nb chloride vapor. The art teaches that quantitative chlorination of Nb, i.e., to $NbCl_4$, is possible above 800° C while below that temperature nonvolatile lower Nb chlorides are obtained. The primary hindrance to obtaining quantitative chlorination at lower temperatures is the formation of $NbCl_3$ by the reaction of $NbCl_5$ with excess Nb according to the following reaction:

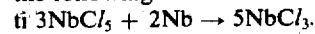
$3NbCl_5 + 2Nb \rightarrow 5NbCl_3$.

$NbCl_3$ has a range of homogeneity and hence does not form stoichiometrically. In addition, it does not vaporize but rather slowly decomposes as a function of temperature and $NbCl_5$ vapor pressure to $NbCl_5$ or possibly $NbCl_4$ if the temperature is sufficiently high. In the prior art, $NbCl_3$ formation has been avoided solely by maintaining the chlorinator and the product salt vapor at a sufficiently high temperature, i.e., above 800° C.

But quantitative chlorination of Nb metal is also possible in the temperature range of about 250° to 260° C. Although $NbCl_3$ is stable at this temperature, the reaction of $NbCl_5$ with the excess Nb in the chlorinator to produce $NbCl_3$ which deposits out does not proceed if the partial pressure of the $NbCl_5$ which is first formed is maintained at or below about 0.1 atm. The partial pressure of the $NbCl_5$ vapor is readily maintained within the desired range by dilution with an inert gas such as Ar. It should be noted that if the pressure of the $NbCl_5$ vapor is allowed to approach 1 atm, $NbCl_3$ formation occurs and quantitative transfer of Nb in the coating train is lost. It can thus be seen that merely by controlling the flow of $Cl_2$ and an inert gas over an excess of Nb metal maintained at about 250° to about 260° C, quantitative chlorination is assured, and $NbCl_5$ vapor is formed at a known rate so that the ratio of Nb to Ge in the coreduction of these chlorides by hydrogen may be easily controlled.

A method for the chemical vapor deposition of bulk coatings of high-transition-temperature $Nb_3Ge$ superconductors utilizing the improved Nb chlorination technique of this invention is shown schematically in the flow chart of the FIGURE. An Ar flow 1 and $Cl_2$ flow 2 are mixed in a ratio of about 4:1 and passed through chlorinator 3 which is a 5 × 30 cm cylindrical nickel chamber maintained at 250° to 260° C and which contains reactor grade Nb tubing either in the form of strips or cuttings. The Ar-$NbCl_5$ salt vapor mixture 7 which emerges from chlorinator 3 may be either passed into the coating train or exhausted 19 through oil bubbler 18 depending on the position of valves 27 and 28.

An Ar flow 9 and $H_2$ flow 10 are mixed in the desired proportions and passed through preheater 8 maintained at 500° C to form hot $H_2$-Ar mixture 22. A 2.5 × 30 cm nickel cylinder may be used as preheater 8. At the same time, an Ar flow 16 is passed through liquid $GeCl_4$ in saturator 15 to form an Ar-$GeCl_4$ vapor mixture 26. In the coating train, mixtures 22, 7, and 26 are joined to form admixture 29 which passes through mixing chamber 11 maintained at 500° C. Chamber 11 contains a plurality of baffles to prevent any channeling of admixture 29 as it passes through. A 5 × 30 cm nickel chamber containing 10 nickel baffles is suitable for this purpose. Admixture 29 then flows through coating chamber 12 where reduction takes place at 900° C according to the following reaction:

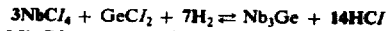

The $NbCl_4$ and $GeCl_2$ which enter the reaction are generated from the $NbCl_5$ and $GeCl_4$ by thermal decomposition as the salt temperatures are increased through the coating train, with the excess chlorine reacting to form HCl. Within coating chamber 12, the deposition area itself consists of the inside surface of a cylindrical hard drawn Cu tube 2.2 × 60 cm surrounded by 1-inch Ni pipe. The Ni pipe serves to protect the Cu tube from direct exposure to the atmosphere as well as to improve the uniformity of the substrate temperature. The mixture 30 of unreacted vapor and produced HCl exiting from chamber 12 is passed through oil bubbler 13 to prevent back diffusion of air and is then flowed to exhaust 14.

Using the foregoing method and apparatus, bulk coatings of $Nb_3Ge$ in the range of 10 to 60 || m thick can easily be produced with a typical deposition efficiency of 50–65% for mass flow rates of the order of 1 g of salt per minute. These coatings have resistive transition temperatures as high as 22.5 K and current densities up to $1.8 \times 10^6$ A-cm² at 13.8 K.

What we claim is:

1. In a method of forming bulk coatings of high transition temperature $Nb_3Ge$ superconductors by the coreduction of flowing Nb and Ge chlorides in the presence of flowing hydrogen, the improvement comprising quantitatively forming $NbCl_5$ vapor at a desired rate by flowing $Cl_2$ gas at a desired rate over an excess of Nb metal at a temperature in the range of about 250° to about 260° C, the partial pressure of said $NbCl_5$ vapor in the presence of said Nb metal being maintained at about 0.1 atm or less, and using said $NbCl_5$ vapor as the source of the Nb chloride used in said coreduction.

2. The method of claim 1 wherein said partial pressure is maintained at a desired level by mixing an appropriate amount of inert gas with said $Cl_2$ gas flowing over said Nb metal.

* * * * *